(12) United States Patent
Park et al.

(10) Patent No.: US 9,567,673 B2
(45) Date of Patent: Feb. 14, 2017

(54) SUBSTRATE SUSCEPTOR AND DEPOSITION APPARATUS HAVING SAME

(75) Inventors: Yong Sung Park, Chungcheongnam-do (KR); Sung Kwang Lee, Chungcheongnam-do (KR); Dong Yeul Kim, Chungcheongnam-do (KR)

(73) Assignee: Kookje Electric Korea Co., Ltd., Chungcheongnam-do (KR)

( * ) Notice: Subject to any disclaimer, the term of this patent is extended or adjusted under 35 U.S.C. 154(b) by 841 days.

(21) Appl. No.: 13/811,989

(22) PCT Filed: Mar. 16, 2011

(86) PCT No.: PCT/KR2011/001819
§ 371 (c)(1),
(2), (4) Date: Jan. 24, 2013

(87) PCT Pub. No.: WO2012/015140
PCT Pub. Date: Feb. 2, 2012

(65) Prior Publication Data
US 2013/0118407 A1 May 16, 2013

(30) Foreign Application Priority Data
Jul. 28, 2010 (KR) ........................ 10-2010-0072963

(51) Int. Cl.
*C23C 16/46* (2006.01)
*C23C 16/455* (2006.01)
(Continued)

(52) U.S. Cl.
CPC ........... *C23C 16/46* (2013.01); *C23C 16/4581* (2013.01); *C23C 16/4584* (2013.01);
(Continued)

(58) Field of Classification Search
CPC ............... C23C 16/46; C23C 16/45551; C23C 16/45565; C23C 16/4581; C23C 16/4584; H01L 21/68771; H01L 21/67109; H01L 21/68764
(Continued)

(56) References Cited

U.S. PATENT DOCUMENTS 4,579,080 A * 4/1986 Martin ................ C23C 16/4411
118/500
5,782,979 A * 7/1998 Kaneno ................ C23C 16/301
118/500
(Continued)

FOREIGN PATENT DOCUMENTS

CN 1695228 A 11/2005
EP 1 069 599 A2 1/2001
(Continued)

OTHER PUBLICATIONS

International Search Report issued in corresponding application No. PCT/KR2011/001819 mailed Nov. 1, 2011.

*Primary Examiner* — Rudy Zervigon
(74) *Attorney, Agent, or Firm* — Carter, DeLuca, Farrell & Schmidt, LLP

(57) ABSTRACT

The present disclosure relates to a deposition apparatus used to manufacture a semiconductor device including a process chamber; a substrate susceptor installed in the process chamber and including a plurality of concentrically arranged stages on which substrates are positioned; a plurality of members for supplying reaction gas; a member for supplying purge gas; a spray member including a plurality of baffles for independently spraying reaction gas and purge gas, supplied from the plurality of members supplying reaction gas and the member supplying purge gas, on the entirety of the treating surfaces of the substrate, in positions corresponding respectively to the substrates positioned on
(Continued)

the stages; and a driving unit for rotating the substrate susceptor or the spray member in order for the baffles of the spray member to sequentially revolve each of the plurality of substrates positioned on the stages.

14 Claims, 9 Drawing Sheets

(51) Int. Cl.
    *C23C 16/458*     (2006.01)
    *H01L 21/67*     (2006.01)
    *H01L 21/687*     (2006.01)

(52) U.S. Cl.
    CPC .. *C23C 16/45551* (2013.01); *C23C 16/45565* (2013.01); *H01L 21/67109* (2013.01); *H01L 21/68764* (2013.01); *H01L 21/68771* (2013.01)

(58) Field of Classification Search
    USPC ...................................... 118/730; 156/345.55
    See application file for complete search history.

(56) References Cited

U.S. PATENT DOCUMENTS

| | | | |
|---|---|---|---|
| 6,436,796 B1 * | 8/2002 | Mailho | ................... C23C 16/46 438/478 |
| 2010/0122710 A1 * | 5/2010 | Kato | ..................... B08B 7/0035 134/1 |

FOREIGN PATENT DOCUMENTS

| | | | |
|---|---|---|---|
| JP | 07-078766 A | 3/1995 |
| JP | 08-139046 A | 5/1996 |
| JP | 09-209151 A | 8/1997 |
| JP | 2000-114182 A | 4/2000 |
| JP | 2001-068423 A | 3/2001 |
| JP | 2001-254181 A | 9/2001 |
| JP | 2010-157736 A | 7/2010 |
| KR | 10-0244954 B1 | 2/2000 |
| KR | 10-0260119 B1 | 7/2000 |
| KR | 10-0687378 B1 | 2/2007 |
| KR | 10-2010-0077695 A | 7/2010 |

* cited by examiner

SUBSTRATE SUSCEPTOR AND DEPOSITION APPARATUS HAVING SAME

TECHNICAL FIELD

The present invention disclosed herein relates to an apparatus used to manufacture a semiconductor device, and more particularly, to a susceptor supporting a substrate and an apparatus including the susceptor to perform a deposition process.

BACKGROUND ART

In a deposition process of processes for manufacturing a semiconductor device, an atomic layer deposition process is introducing to improve conformability of a deposited layer. The atomic layer deposition process is a process in which a unit reaction cycle for depositing a layer with a thickness similar to that of an atomic layer is repeated to form a deposition layer with a desired thickness. However, according to the atomic layer deposition process, it takes a long time to grow a layer having a desired thickness because a deposition rate is very slow when compared to a chemical vapor deposition process or a sputtering process. Thus, productivity may be decreased.

Furthermore, temperature uniformity of a susceptor on which a substrate is placed is one of the biggest factors, which have an influence on uniformity with respect to a thickness of a thin film to be deposited on the substrate. The susceptor may thermally affect the substrate according to a disposition shape of a heating element to cause non-uniformity of the layer. Thus, the susceptor should have a thick thickness to reduce the influence of the heating element arrangement, thereby securing the temperature uniformity.

SUMMARY

Technical Problem

The present invention provides a substrate susceptor capable of improving thermal efficiency and a deposition apparatus having the same.

The present invention also provides a substrate susceptor capable of minimizing a loss of heat generated from a heating element without heating a substrate and a deposition apparatus having the same.

The present invention also provides a substrate susceptor capable of improving temperature uniformity and a deposition apparatus having the same.

The feature of the present invention is not limited to the aforesaid, but other features not described herein will be clearly understood by those skilled in the art from descriptions below.

Technical Solution

In order to solve the aforementioned problems, embodiments of the present invention provide deposition apparatuses including: a process chamber; a substrate susceptor in which a plurality of substrates are placed on the same plane, the substrate susceptor being disposed in the process chamber; and a spray member disposed at a position corresponding to that of each of the plurality of substrates placed on the substrate susceptor to spray a gas onto an entire processing surface of the substrates, wherein the substrate susceptor includes: an upper susceptor including stages on which the substrates are placed on a top surface thereof; a lower susceptor coupled to a bottom surface of the upper susceptor, the lower susceptor including a heating element for heating the substrate disposed on an area corresponding to each of the stages; and a barrier member disposed on a bottom surface of the lower susceptor to prevent heat energy from being radiated into the bottom of the lower susceptor.

In some embodiments, the substrate susceptor may have a radiant space for transferring heat between the lower susceptor and the barrier member.

In other embodiments, the barrier member may include a plate-shaped barrier plate on which a reflective coating layer is disposed on a top surface thereof contacting the radiant space, wherein the barrier plate may be disposed corresponding to the stages.

In still other embodiments, the barrier plate may have a curved top surface or an inclined top surface.

In even other embodiments, the barrier plate may include patterns having an intaglio or relievo roughness on the top surface thereof to concentrate a radiant angle of heat energy into a specific area.

In yet other embodiments, the substrate susceptor may include a pore for transferring a heating source of the heating element between the upper susceptor and the lower susceptor, which are disposed under the states, in a radiative transfer manner.

In further embodiments, the pore is filled with a silicon carbide-based material in which a carbon nano tube having high heat capacity and low heat conductivity is mixed.

In order to achieve the above problems, a substrate susceptor comprising: an upper susceptor comprising a plurality of stages on which substrates are placed on a concentric circle thereof; a lower susceptor coupled to a bottom surface of the upper susceptor, the lower susceptor comprising a heating element for heating the substrate; and a barrier plate disposed corresponding to each of the stages on a bottom surface of the lower susceptor, to resupply heat energy radiated from the lower susceptor toward the upper susceptor, thereby improving heat efficiency.

In some embodiments, the substrate susceptor may include: a first pore uniformly transferring the heat energy of the heating element between the upper susceptor and the lower susceptor, which are disposed under the stages; and a second pore transferring the heat energy reflected from the barrier plate between the lower susceptor and the barrier plate.

In other embodiments, the barrier plate may have a reflective coating layer is disposed on a top surface thereof contacting the second pore, and the barrier plate may include patterns having an intaglio or relievo roughness on the top surface of the barrier plate thereof to concentrate a radiant angle of heat energy into a specific area.

Advantageous Effects

According to the present invention, the substrate placed on the susceptor may be minimized in temperature distribution deviation.

Also, according to the present invention, the thermal efficiency during the heating may be improved.

DETAILED DESCRIPTION

Figure 1:
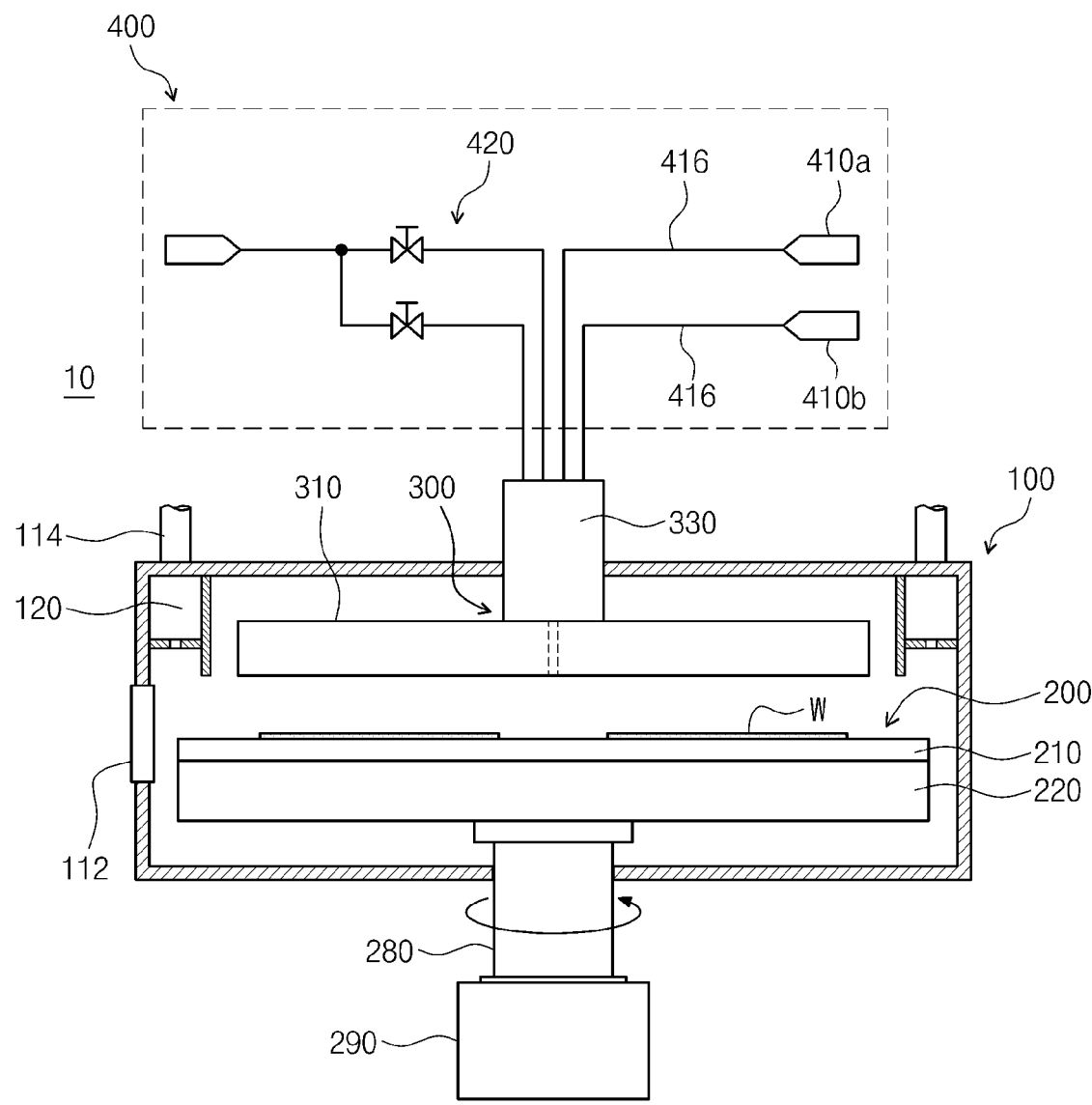
FIG. 1 is a view of an atomic layer deposition apparatus according to the present invention.

Preferred embodiments of the present invention will be described below in more detail with reference to the accompanying drawings. The objective, technical solution, and merits of the present invention may be easily understood through the accompanying drawings and related embodiments. In the drawings, the dimensions of layers and regions are exaggerated for clarity of illustration. It is noted that like reference numerals denotes like elements in appreciating the drawings. Moreover, detailed descriptions related to well-known functions or configurations will be ruled out in order not to unnecessarily obscure subject matters of the present invention.

Embodiments

Figure 2:
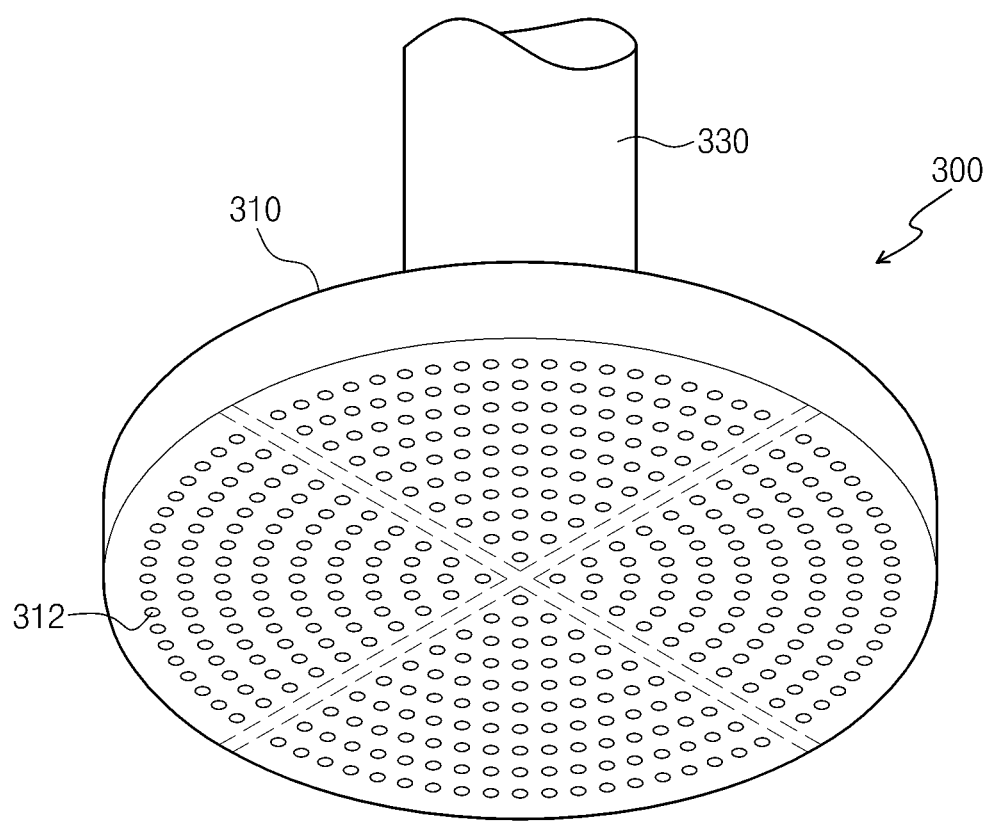
FIGS. 2 and 3 are perspective and cross-sectional views of a spray member shown in FIG. 1.
Figure 3:
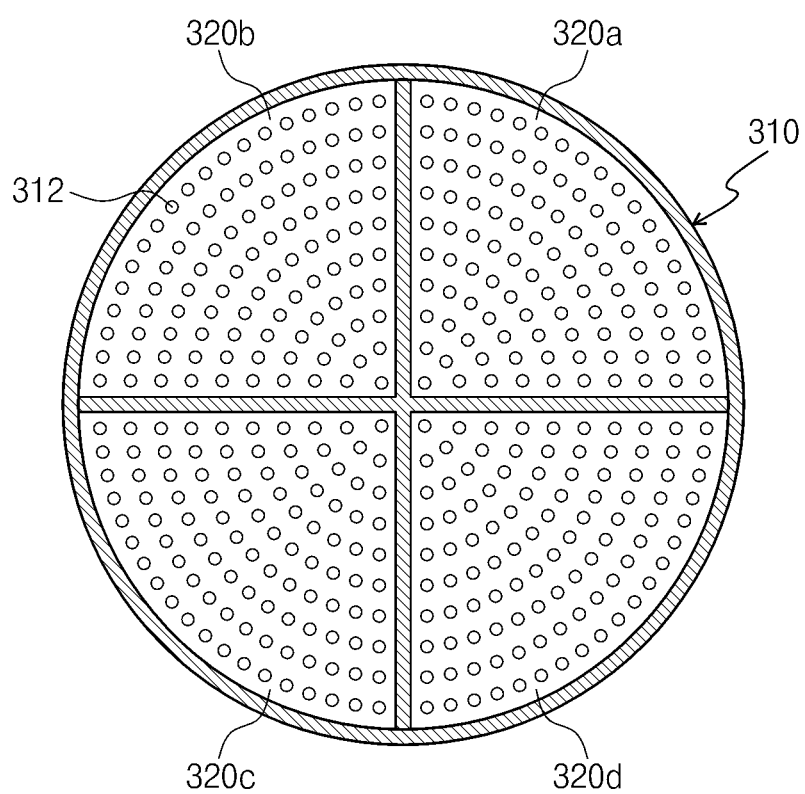
Figure 4:
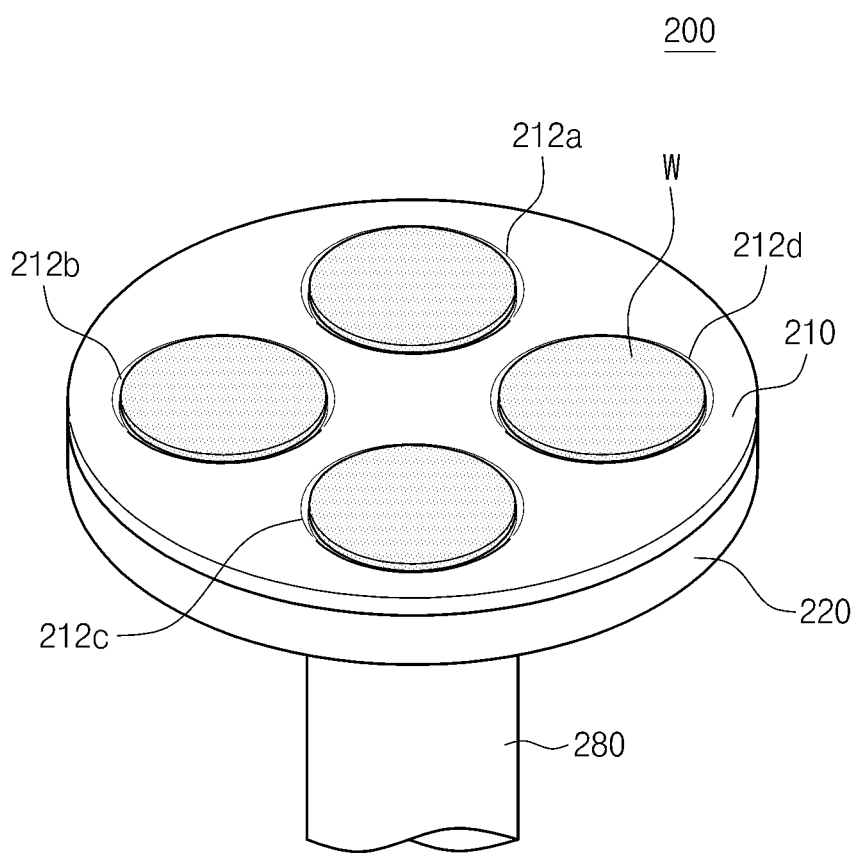
FIG. 4 is a perspective view of a substrate susceptor shown in FIG. 1.

FIG. 1 is a view of an atomic layer deposition apparatus according to the present invention. FIG. 2 is an exploded perspective view of a spray member of FIG. 1. FIG. 3 is a cross-sectional view of the spray member of FIG. 1. FIG. 4 is a perspective view of a substrate susceptor shown in FIG. 1.

Referring to FIGS. 1 to 4, an atomic layer deposition apparatus 10 includes a process chamber 100, a substrate susceptor 200 that is a substrate support member, a spray member 300, and a supply member 400.

The process chamber 100 has an entrance 112 in a side thereof. Substrates W may be loaded or unloaded into/from the process chamber 100 through the entrance 112 during the processing. Also, the process chamber 100 includes an exhaust duct 120 and an exhaust tube 114 which exhaust a reaction gas and purge gas, which are supplied therein, and byproducts generated during an atomic layer deposition process at an upper edge thereof. The exhaust duct 120 is disposed outside the spray member 300 and has a ring shape. Although not shown, a vacuum pump, and a pressure control valve, a switching valve, and a flow control valve may be installed in the exhaust tube 114.

Referring to FIGS. 1 to 3, the spray member 300 sprays a gas onto each of four substrates placed on the substrate susceptor 200. The spray member 300 receives first and second reaction gases and a purge gas from the supply member 400. The spray member 400 is configured to spray the gases supplied from the supply member 400 onto an entire processing surface of each of the substrates at positions corresponding to those of the substrates. The spray member 300 includes a head 310 and a shaft 330. The head 310 includes first to fourth baffles 320a to 320d, respectively. The shaft 330 is disposed on an upper center of the process chamber 100 to support the head 310. The head 310 has a disk shape. Also, the first and fourth baffles 320a to 320d have independent spaces for receiving the gases into the head 310, respectively. The first to fourth baffles 320a to 320d have fan shapes which are successively partitioned by an angle of about 90 degrees with respect to a center of the head 310, respectively. Gas discharge holes 312 are defined in bottom surfaces of the first to fourth baffles 320a to 320d, respectively. The gases supplied from the supply member 400 are supplied into the independent spaces of the first to fourth baffles 320a to 320d, respectively. The gases are sprayed through the gas discharge holes 312 and then provided onto the substrate. A portion of the baffles 320a to 320d may supply a different kind of gas. Portions of the baffles 320a to 320d may have supply the same gas. For example, a first reaction gas is supplied into the first baffle 320a, and a second reaction gas is supplied into the third baffle 320c facing the first baffle 320a. Also, the purge gas for preventing the first and second reaction gases from being mixed with each other and for purging a non-reaction gas is supplied into the second and fourth baffles 320b and 320d.

For example, the head 310 may have a fan shape in which the first to fourth baffles 320a to 320d are successively arranged at about 90 degrees. However, the present invention is not limited thereto. For example, four baffles or less or more may be provided according to purposes and characteristics of the process. For example, eight baffles may be successively arranged at about 45 degrees. Alternatively, two baffles may be arranged at about 180 degrees. Also, the whole or a portion of the baffles may have sizes different from each other.

Referring again to FIG. 1, the supply member 400 includes a first gas supply member 410a, a second gas supply member 410b, and a purge gas supply member 420. The first gas supply member 410a supplies the first reaction gas for forming a predetermined thin film on a substrate W into the first baffle 320a. The second gas supply member 410b supplies the second reaction gas into the third baffle 320c. The purge gas supply member 420 supplies the purge gas into the second and fourth baffles 320b and 320d. Here, the purge gas supply member 420 continuously supplies the purge gas at a uniform flow rate. However, the first and second gas supply members 410a and 410b discharge (a flash supply manner) the reaction gas charged at a high pressure using a high pressure charging tank (not shown) for a short time to diffuse the reaction gas on the substrate.

Although two gas supply members are provided to supply two reaction gases different from each other in the current embodiment, the present invention is not limited thereto. For example, a plurality of gas supply members may be applied to supply at least three reaction gases different from each other according to the process characteristics.

Referring to FIGS. 1 and 4, the substrate susceptor 200 is installed in an inner space of the process chamber 100. The substrate susceptor 200 may be a batch type in which four substrates are placed. The substrate susceptor 200 is rotated by a driving unit 290. A stepping motor including an encoder which is capable of controlling a rotation rate and speed of a driving motor may be used as the driving unit 290 rotating the substrate susceptor 200. A process time of one cycle (first reaction gas—purge gas—second reaction gas—purge gas) of the spray member 300 may be controlled by the encoder.

The substrate susceptor 200 may have three stages, but four stages, or four stages or more.

Although not shown, the substrate susceptor 200 may include a plurality of lift pins (not shown) for lifting the substrate W on each stage. The lift pins lifts the substrate W to space the substrate W from the stage of the substrate susceptor 200 or seat the substrate W on the stage.

The substrate susceptor 200 includes an upper susceptor 210, a lower susceptor 220, a heating element 230, a barrier member 240, and a support pillar 280 supporting the lower susceptor 220.

The upper susceptor 210 is coupled to the lower susceptor 220 to overlap with each other in a disk shape on which first to fourth stages 212a to 212d on which the substrates are mounted are disposed. Each of the first to fourth stages 212a to 212d disposed on the upper susceptor 210 may have a circular shape similar to that of the substrate W. The first to fourth stages 212a to 212d may be successively disposed on a concentric circle at an angular distance of about 90 degrees with respect to the center of the substrate susceptor 200.

The lower susceptor 220 includes the heating element 230 for heating the substrate W seated on each of the stages 212a to 212d of the upper stage 210 on a top surface thereof. A heating wire may be used as the heating element 230. The heating element 230 is disposed in an insertion groove 228 defined in the top surface of the lower susceptor 220 in a state where the heating element 230 is supported by a holder 232. The holder 232 may be disposed on the whole heating element 230. Alternatively, the holders are successively disposed with a predetermined length or a predetermined angle (for example, about 90 degrees or 45 degrees) to fix the respective heating elements 230. The heating element 230 heats the upper susceptor 210 and the lower susceptor 220 to increase a temperature of the substrate W to a preset temperature (a process temperature). The heating wire of the heating element 230 may be disposed in different manners on a stage area (the heating wire is densely disposed) on which the substrate W is placed and an area (the heating wire is dispersedly disposed) except the stage area to increase a temperature of the stage area on which the substrate W is placed and decrease a temperature of the area except the stage area, thereby depositing the thin film only on the substrate W.

Figure 5:
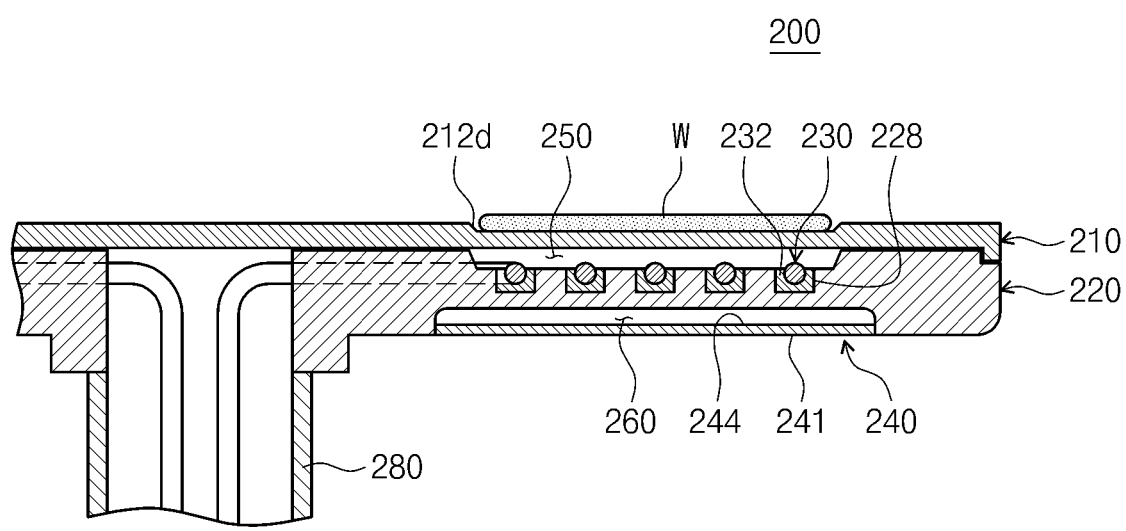
FIG. 5 is a cross-sectional view of a main part of the substrate susceptor.

FIG. 5 is a cross-sectional view of a main part of the substrate susceptor. Referring to FIG. 5, a first pore 250 having a diameter of several mm is defined between the upper susceptor 210 and the lower susceptor 220. Also, a second pore 260 having a diameter of several mm is defined between the lower susceptor 220 and the barrier member 240.

The first pore 250 is defined between the upper susceptor 210 and the lower susceptor 220 under the state. Heat energy of the heating element 230 may be transferred into the upper susceptor 210 in a radiative transfer method, not a conductive method and therefore temperature uniformity of the upper susceptor 210 is improved. As another example, although not shown, a heat transfer sheet formed of a silicon carbide-based material having high heat capacity and low heat conductivity may be disposed in the first pore 250 to improve a heat transfer rate. The heat transfer sheet has a single or multi layer structure in which a carbon nano tube for transferring heat into silicon carbide in one direction is mixed. The carbon nano tube may be adjusted in mixture ratio for each area (a central portion and an edge portion) of the heat transfer sheet to control a heat transfer ratio for each area of the heat transfer sheet.

Referring again to FIG. 5, the barrier member 240 may prevent a portion of the heat energy generated in the heating element 230 disposed on the top surface of the lower susceptor 220 from being radiated into a bottom surface of the lower susceptor 220, thereby preventing a loss of the heat energy. The barrier member 240 is disposed on the bottom surface of the lower susceptor 220. The second pore 260 that is a radiant space for transferring heat is defined between the barrier member 240 and the lower susceptor 220.

The barrier members 240 are arranged with an angle of about 90 degree on a concentric circle with respect to a center of the substrate susceptor 200 and disposed on the bottom surface of the lower susceptor 220 corresponding to the respective stages, like the stages. The barrier member 240 includes a barrier plate 241, having a circular plate shape, on which a reflective coating layer 244 is coated so that the heat energy radiated into the bottom surface of the lower susceptor 220 is resupplied toward the lower susceptor 220 to improve thermal efficiency. The barrier plate 241 is formed of a material having a low heat capacity such as quartz. Also, a thin film 244 (a reflective coating layer) formed of platinum or molybdenum, which is thermally and chemically stable, is coated on a surface of the barrier plate 241 to improve reflective efficiency.

The barrier plate 241 may have various shapes except the flat plate shape as shown in FIG. 4.

FIGS. 6 to 9 are views illustrating various modified examples of a barrier member.

Figure 6:
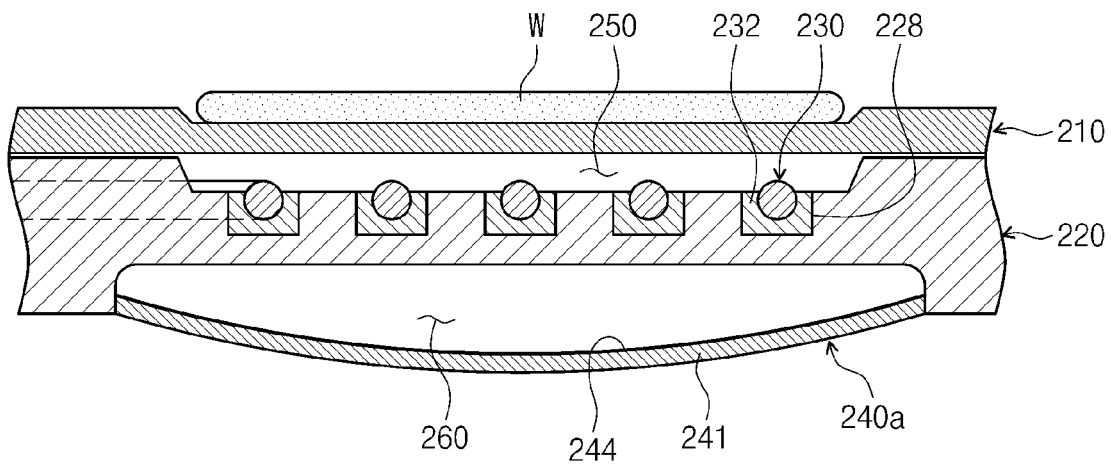
FIGS. 6 to 9 are views illustrating various modified examples of a barrier member.
Figure 7:
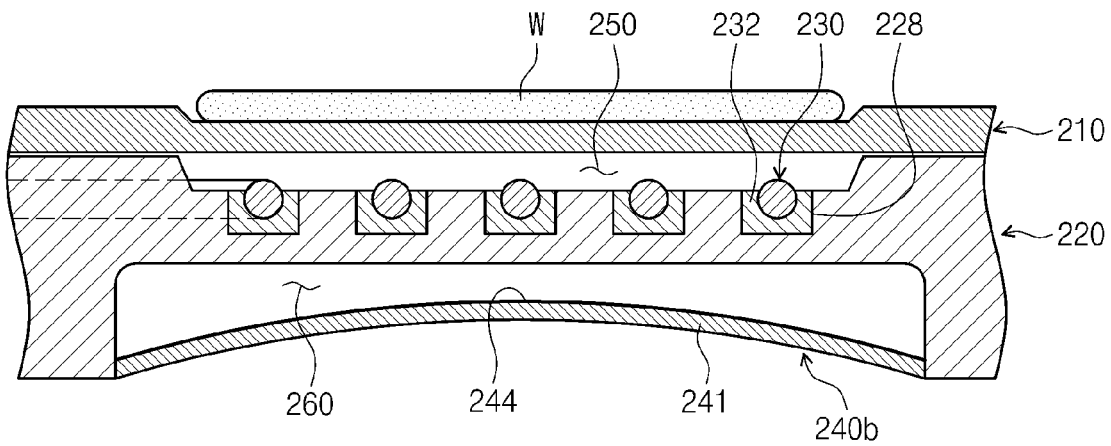

Referring to FIGS. 6 and 7, a barrier plate 241 of barrier member 240a or 240b may have a concave or convex shape. That is, in the case where the barrier plate 241 has the concave shape recessed from an edge portion toward a central portion, a retro-reflective angle of the radiant energy may be concentrated into the central portion. On the other hand, in the case where the barrier plate 241 has the convex shape protruding form an edge portion toward a central portion, the retro-reflective angle of the radiant energy may be concentrated into the edge portion. That is, the barrier plate 241 may have variously changed in shape so that the reflective angle of the radiant energy is concentrated into a specific area to further increase a temperature of the specific area.

Figure 8:
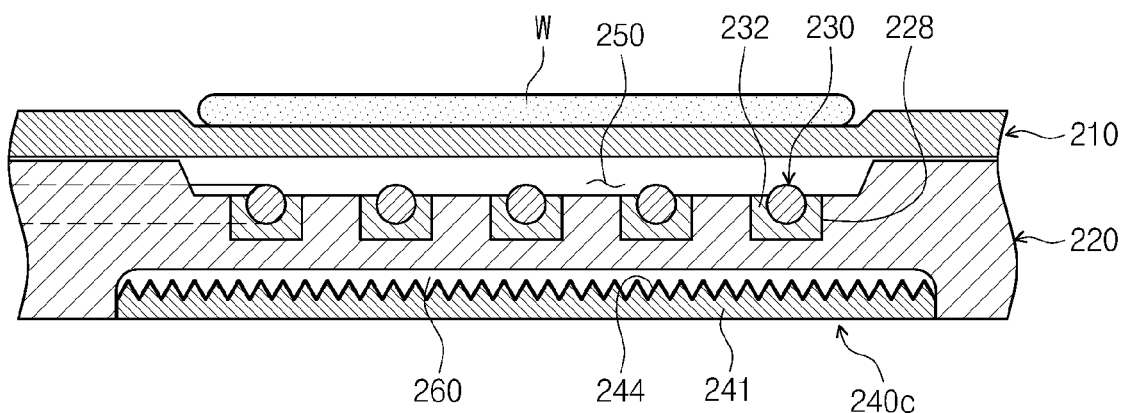

Referring to FIG. 8, patterns having a roughness may be disposed on a top surface of the barrier plate 241 of a barrier member 240c. The patterns may improve the retro-reflective efficiency of the radiant energy radiated from the bottom surface of the lower susceptor 220 and adjust the retro-reflective angle. Also, the barrier member 240c may further increase a temperature of the specific area by using the patterns to improve reflectance. The patterns may include intaglio patterns or relievo patterns. Alternatively, each of the patterns may have various shapes such as a dotted shape, a polygonal shape, a V shape, and a cone shape.

Figure 9:
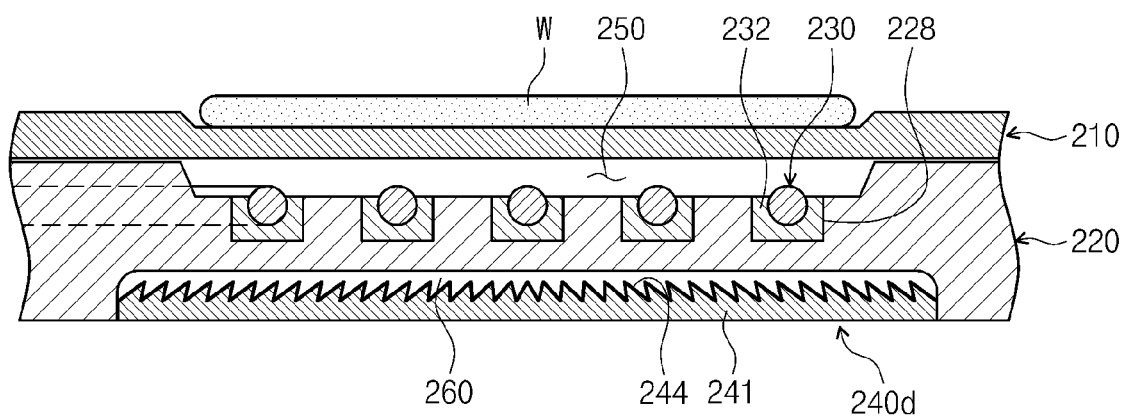

The barrier member 240d shown in FIG. 9 may be configured to concentrate the reflective angle of the radiant energy into the specific area by forming the patterns having shapes different from each other on the central and edge portions of the top surface of the barrier plate 241.

Figure 10:
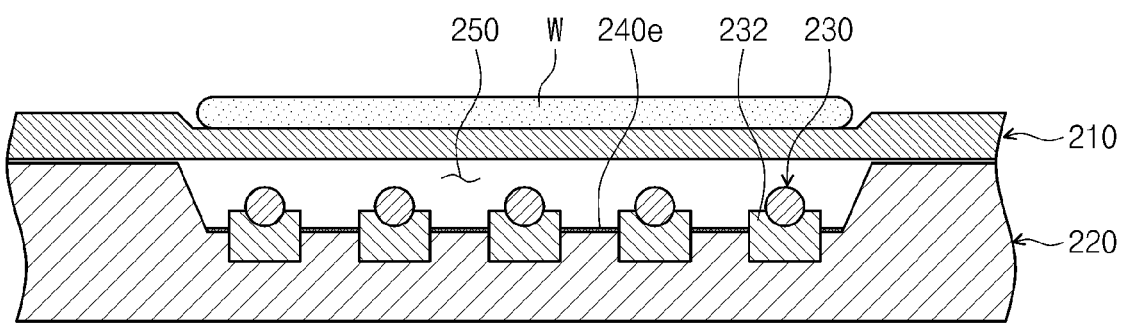
FIG. 10 is a view of a barrier member according to another embodiment of the present invention.

FIG. 10 is a view of a barrier member according to another embodiment of the present invention. In FIG. 10, a barrier member 240e is disposed on a top surface of a lower susceptor 220. In this case, the barrier member 240e retro-reflects radiant energy radiated from a bottom surface of an upper susceptor 210 and lower radiant energy of a heating element. Here, the heating element 230 may be disposed at a position higher than that of a top surface of the lower susceptor 220 to improve reflective efficiency, thereby further exposing the heating element 230 to a first pore. When the heating element 230 is exposed to the top surface of the lower susceptor 220, the radiant energy emitted from the heating element 230 toward the top surface of the lower susceptor 220 may be reflected in a direction of the upper susceptor 210 to improve thermal efficiency.

Figure 11:
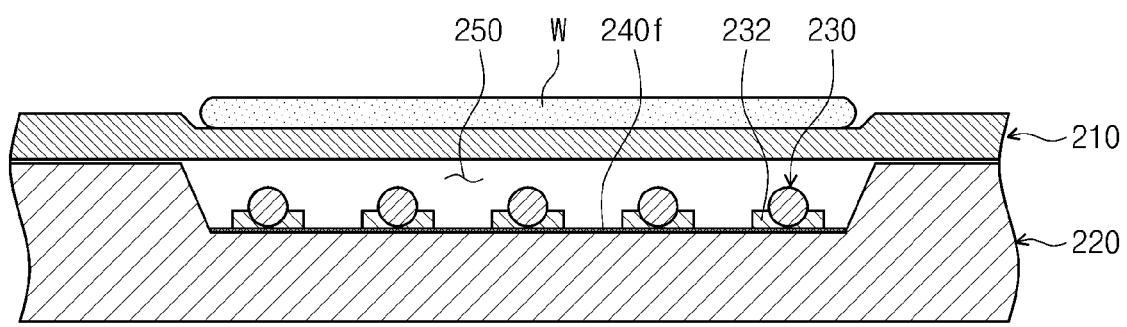
FIG. 11 is a view illustrating a modified example of the barrier member shown in FIG. 10.

FIG. 11 is a view illustrating a modified example of the barrier member shown in FIG. 10. A heating element 230 is directly disposed on a top surface of a barrier member 240f and thus is disposed on a top surface of the lower susceptor. Also, the heating element 230 is fixed to the top surface of the barrier member 240f by holders 232. Also, the holders 232 may be disposed with a predetermined distance or at a predetermined angle.

Figure 12:
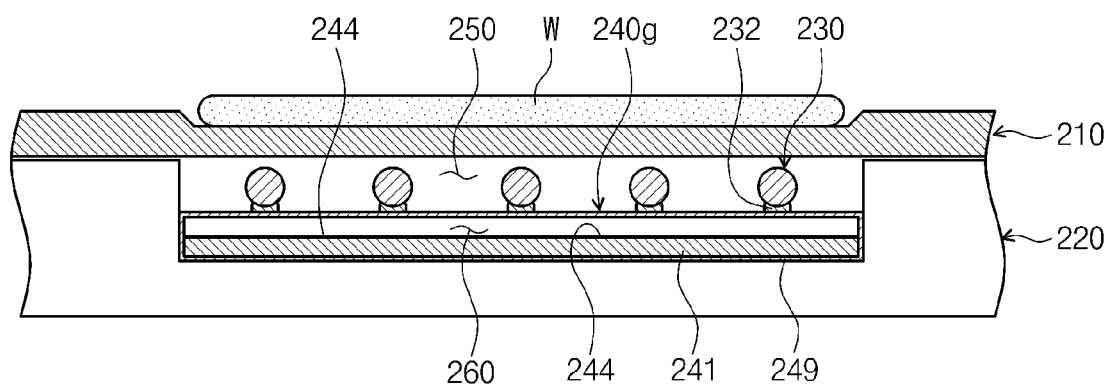
FIG. 12 is a view of a barrier member according to another embodiment of the present invention.
Figure 13:
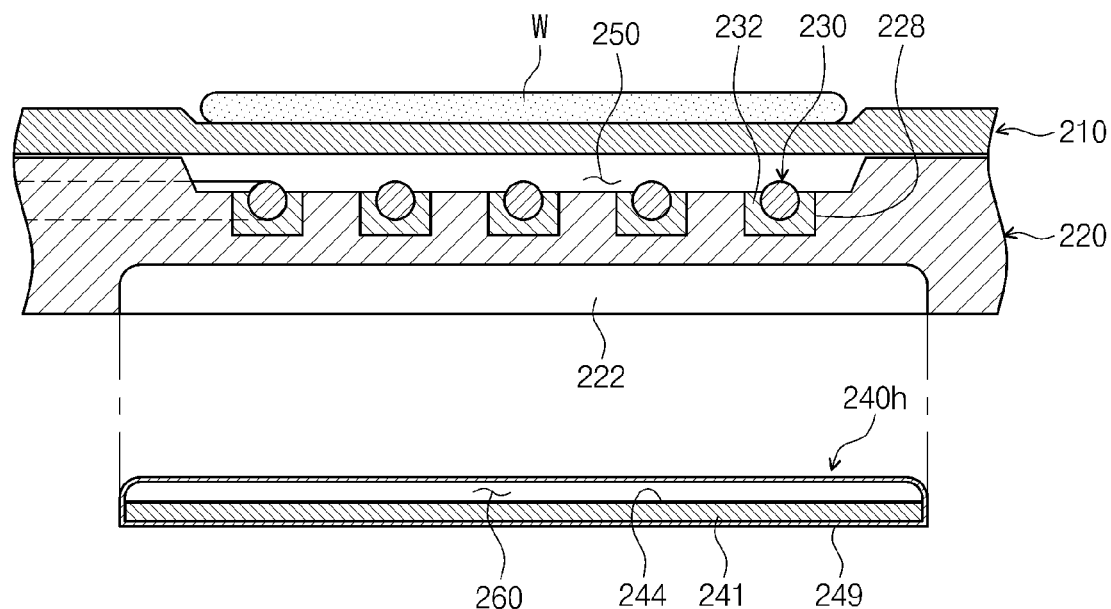
FIG. 13 is a view of a barrier member according to another embodiment of the present invention.

FIGS. 12 and 13 are views of a barrier member according to another embodiment of the present invention.

Referring to FIGS. 12 and 13, each of barrier members 240g and 240h includes a barrier plate 241, having a circular plate shape, on which a reflective coating layer 244 is coated and a case 249 sealing the barrier plate 241 and having a second pore 260 that is a radiant space for transferring heat. The case 249 is formed of transparent quartz. The case 249 may prevent a process gas (a reaction gas) from being permeated, thereby preventing reflectance from being deteriorated due to the contamination of a barrier plate 241 and a reflective coating layer 244, an abnormal reaction, and impurities.

As shown in FIG. 8, the barrier member 240g may be disposed on a top surface of a lower susceptor 220. In this case, a heating element 230 is disposed on a top surface of a case 249 of the barrier member 240g.

Also, as shown in FIG. 13, the barrier member 240h may be disposed on a bottom surface of the lower susceptor 220. Since the barrier member 240h has a radiant space for transferring heat in itself, the barrier member 240h may be closely attached to the lower susceptor 220 without providing a separate space between the barrier member 240h and the lower susceptor 220.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A deposition apparatus comprising:
a process chamber;
a substrate susceptor in which a plurality of substrates are placed on the same plane, the substrate susceptor being disposed in the process chamber; and
a spray member disposed at a position corresponding to that of each of the plurality of substrates placed on the substrate susceptor to spray a gas onto an entire processing surface of the substrates,
wherein the substrate susceptor comprises:
an upper susceptor comprising stages on which the substrates are placed on a top surface thereof;
a lower susceptor coupled to a bottom surface of the upper susceptor, the lower susceptor comprising a heating element for heating the substrate disposed on an area corresponding to each of the stages; and
a barrier member sealing a radiant space between the barrier member and the lower susceptor to prevent heat energy from being radiated into a space below a horizontal level of the barrier member.

2. The deposition apparatus of claim 1, wherein the radiant space is arranged to transfer heat between the lower susceptor and the barrier member.

3. The deposition apparatus of claim 2, wherein the barrier member comprises a plate-shaped barrier plate on which a reflective coating layer is disposed on a top surface thereof contacting the radiant space, wherein the barrier plate is disposed corresponding to the stages.

4. The deposition apparatus of claim 3, wherein the barrier plate has a curved top surface or an inclined top surface.

5. The deposition apparatus of claim 3, wherein the barrier plate has a concave top surface or a convex top surface.

6. The deposition apparatus of claim 3, wherein the barrier plate comprises patterns having an intaglio or relievo roughness on the top surface thereof to concentrate a radiant angle of heat energy into a specific area.

7. The deposition apparatus of claim 2, wherein the substrate susceptor comprises a pore for transferring a heating source of the heating element between the upper susceptor and the lower susceptor, which are disposed under the stages, in a radiative transfer manner.

8. The deposition apparatus of claim 7, wherein the pore is filled with a silicon carbide-based material having high heat capacity and low heat conductivity.

9. A deposition apparatus comprising:
a process chamber;
a substrate susceptor disposed in the process chamber, the substrate susceptor comprising a plurality of stages on which substrates are disposed on a concentric circle;
a plurality of gas supply members supplying a reaction gas;
a purge gas supply member supplying a purge gas;
a spray member comprising a plurality of independent baffles to independently spray the reaction gas and purge gas supplied from the plurality of gas supply member and the purge gas supply member onto an entire processing surface of the substrate at a position corresponding to that of the substrates respectively disposed on the plurality of stages; and
a driving unit rotating the substrate susceptor or the spray member so that the baffles of the spray member are successively rotated toward each of the substrates placed on the plurality of stages,
wherein the substrate susceptor comprises:
an upper susceptor on which the plurality of stages are disposed;
a lower susceptor coupled to a bottom surface of the upper susceptor, the lower susceptor comprising a healing element for heating the substrates; and
a plurality of barrier plates corresponding to the plurality of stages, respectively, wherein each of the plurality of barrier plate seals a respective radiant space between the respective barrier plate and the lower susceptor, to resupply heat energy, which is radiated from the bottom surface of the lower susceptor, toward the lower susceptor, thereby improving thermal efficiency.

10. The deposition apparatus of claim 9, wherein the substrate susceptor comprises:
a pore uniformly transferring the heat energy of the heating element between the upper susceptor and the lower susceptor, which are disposed under the stages.

11. The deposition apparatus of claim 10, wherein the barrier plate has a concave or convex top surface on which a reflective coating layer is disposed.

12. The deposition apparatus of claim 11, wherein the barrier plate comprises patterns having an intaglio or relievo roughness on the top surface thereof.

13. The deposition apparatus of claim 1, wherein the barrier member covers an area corresponding to a respective stage.

14. The deposition apparatus of claim 9, wherein each of the plurality of barrier plates covers a respective area corresponding to a respective stage.

\* \* \* \* \*